United States Patent [19]
Moritsu

[11] Patent Number: 4,774,486
[45] Date of Patent: Sep. 27, 1988

[54] COIL MOUNTING FOR NMR DIAGNOSTIC APPARATUS

[75] Inventor: Kazuki Moritsu, Ako, Japan

[73] Assignee: Mitsubishi Denki Kabushiki Kaisha, Tokyo, Japan

[21] Appl. No.: 26,370

[22] PCT Filed: Mar. 27, 1986

[86] PCT No.: PCT/JP86/00144
§ 371 Date: Jan. 22, 1987
§ 102(e) Date: Jan. 22, 1987

[87] PCT Pub. No.: WO86/07459
PCT Pub. Date: Dec. 18, 1986

[30] Foreign Application Priority Data
Jun. 4, 1985 [JP] Japan .................................. 60-119790
Jun. 6, 1985 [JP] Japan .................................. 60-121516

[51] Int. Cl.⁴ .............................................. H01F 5/00
[52] U.S. Cl. ...................................... 335/299; 324/318
[58] Field of Search ............... 335/296, 299; 324/318, 324/319, 320, 321

[56] References Cited
U.S. PATENT DOCUMENTS
4,636,729 1/1987 Maurer et al. ..................... 335/299
4,639,672 1/1987 Beaumont ......................... 324/319

FOREIGN PATENT DOCUMENTS
0011335 5/1980 European Pat. Off. ............ 335/299
0123075 10/1984 European Pat. Off. ............ 335/299
0142760 5/1985 European Pat. Off. ............ 335/299

OTHER PUBLICATIONS
Patent Abstracts of Japan, vol. 9, No. 86, Apr. 16, 1985 59-216045, Hitachi Seisakusho.

Primary Examiner—George Harris
Attorney, Agent, or Firm—Sughrue, Mion, Zinn, Macpeak and Seas

[57] ABSTRACT

A mounting structure for the inclined magnetic field coils of an NMR imaging diagnostic apparatus, wherein the windings 9, 9 ... of the coils 3, 4, 5 are disposed in the magnetic field generated by a main coil 2 and are wound around and held on a bobbin 6 via an interposed vibrationproofing material 13. In a second embodiment, the windings 9, 9 ... and the bobbin 6 are integrally molded with a damping material 15.

5 Claims, 3 Drawing Sheets

PRIOR ART
FIG. 2
PRIOR ART
FIG. 3
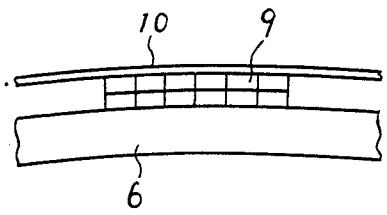
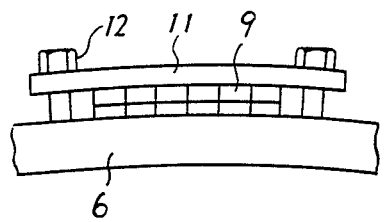
PRIOR ART
FIG. 4
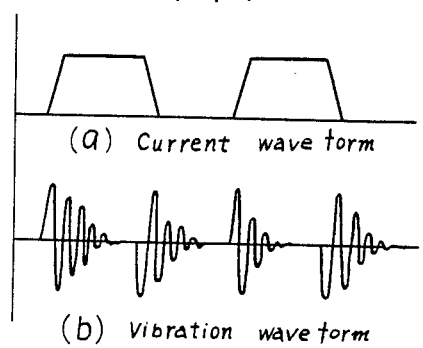
(a) Current wave form
(b) Vibration wave form
FIG. 5
FIG. 6
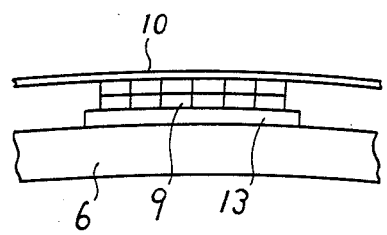
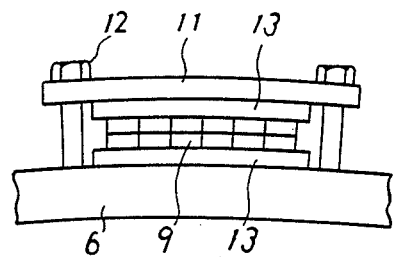

COIL MOUNTING FOR NMR DIAGNOSTIC APPARATUS

TECHNICAL FIELD

The present invention relates to a coil used for a nuclear magnetic resonance (NMR) imaging diagnostic apparatus, and more particularly to inclined magnetic field coils used for obtaining position information in an NMR imaging diagnostic apparatus.

BACKGROUND ART

FIG. 1 shows a magnetic portion of a conventional superconductive NMR imaging diagnostic apparatus, comprising a superconductive main coil 2 contained in a cryostat 1, inclined magnetic field coils 3, 4 and 5 disposed inside the main coil 2, a bobbin 6, and a bed unit 7, so that an examinee is positioned within the bobbin 6. The inclined magnetic field coils comprising two pairs of X-direction coils 3, 3 . . . , each having a saddle-like shape and disposed transversely, two pairs of Y-direction coils 4, 4 . . . , each having a saddle-like shape and disposed vertically, and a pair of Z-direction solenoid-type coils 5, 5 disposed longitudinally, are mounted on the bobbin 6 formed of a non-conductive material.

The coils 3, 4, 5 are mounted on the bobbin 6 in such a manner that the windings 9, 9 . . . of each coil, as shown in FIG. 2, are secured to the bobbin 6 by a band 10, such as a glass fiber tape, or the windings 9, 9 . . . , as shown in FIG. 3, are press-contacted by bolts 12, 12 . . . through a pressure plate 11.

In such an apparatus, the inclined magnetic coils 3, 4 and 5 are excited by the intense DC magnetic field generated by the main coil 2, at which time a current flowing in the coils, as shown in FIG. 4(a), is of pulse-like wave form, so that the coils 3, 4 and 5 each generates an electromagnetic mechanical force, thereby vibrating as the current varies as shown in FIG. 4(b).

The electromagnetic mechanical force generated in the coils 3, 4 and 5 is similar in wave form to the current shown in FIG. 4(a). Hence, the frequency component of the mechanical force is distributed over a wide frequency domain of DC to kHz, vibrations and noises caused thereby having the similar frequency component.

The conventional inclined magnetic field coil, whose windings are fixed directly to the bobbin, transmits its vibrations to the bobbin directly. As a result, a problem has occurred in that noises emitted together with the vibrations of the bobbin cause pain to the examinee positioned inside the bobbin.

SUMMARY OF THE INVENTION

In order to solve the above problem, the present invention has been designed to provide a coil used for a nuclear magnetic resonance imaging diagnostic apparatus which reduces vibrations and noises. Such a coil, according to a first embodiment of the invention, comprises inclined magnetic field coils fixed to a bobbin with a vibrationproofing material interposed therebetween.

In this embodiment, the audible high frequency components in the wide frequency component range of the generated noises is attenuated from the vibrations transmitted from the coil to the bobbin through the vibrationproofing material, such as rubber. In this case, when the characteristic frequency depending on the mass of coil and on the spring constant of the vibrationproofing material is represented by $f_n$, the attenuated frequency component is $\sqrt{2} \times f_n$ or more.

In the first embodiment, by adding a mass body of non-magnetic material, such as stainless steel to the inclined magnetic field coils, the coil mass increases and the characteristic frequency of the coil lowers to expand the frequency domain having the damping effect.

A coil according to a second embodiment of the invention comprises inclined magnetic field coils and a bobbin which are integrally molded by a damping material.

In the second embodiment, since the coils and bobbin are integrally molded by damping material, such as epoxy derivative binary reaction type resin, the damping effect is extremely high, thereby remarkably reducing an abrupt damped vibration generated during the rising and the falling of the current.

BRIEF DESCRIPTION OF THE DRAWINGS

FIGS. 2 and 3 are partially sectional views of construction of holding conventional inclined magnetic field coils on a bobbin, FIG. 4 is a wave form chart of a current flowing in the inclined magnetic field coils and vibrations thereof, FIG. 5 is a partially sectional view of an embodiment of a coil used for a nuclear magnetic resonance imaging diagnostic apparatus according to a first embodiment, FIGS. 6 through 8 are partially sectional views of modifications of the first embodiment respectively.

DETAILED DESCRIPTION OF THE PREFERRED EMBODIMENTS

Figure 1:
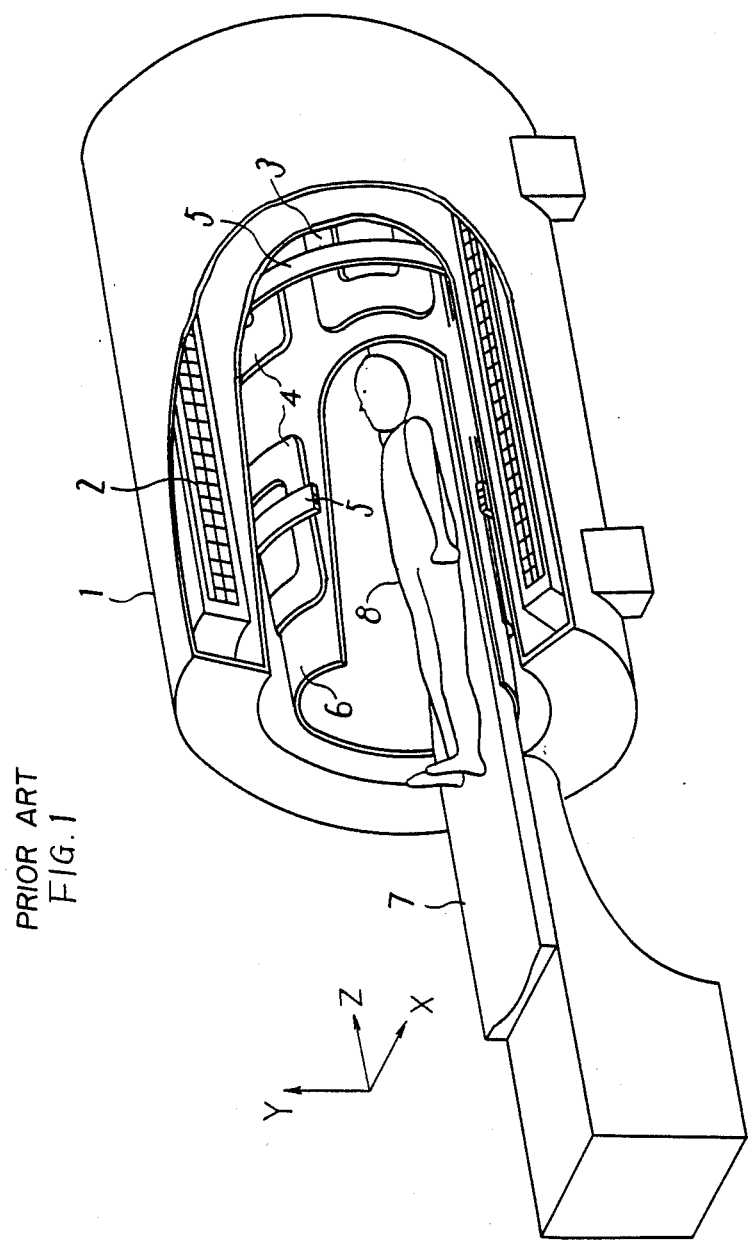
FIG. 1 is a partially cutaway perspective view of the principal portion of a conventional nuclear magnetic resonance imaging diagnostic apparatus.

FIG. 5 shows a first embodiment of the invention in which, windings 9, 9 . . . of inclined magnetic field coils are secured to a bobbin 6 by a band 10 with vibrationproofing rubber 13 interposed therebetween.

FIG. 6 shows a modification of the first embodiment, in which the windings 9, 9 . . . are secured between the bobbin 6 and a pressure plate 11 with vibrationproofing rubber 13, 13 interposed between the windings and the bobbin 6 and between the windings and the pressure plate 11 respectively and fixed to the bobbin 6 by bolts 12, 12 . . . through the pressure plate.

In the above constructions, the inclined magnetic field coils whose windings 9, 9 . . . are supported to the bobbin 6 in a vibrationproofing condition are excited and when generating an electromagnetic mechanical force, they vibrate in the same way as the conventional coils, but the high frequency vibrations otherwise transmitted to the bobbin 6 are attenuated and the vibrations of the bobbin 6 are reduced, thereby reducing the noises emitted from the bobbin 6.

Figure 7:
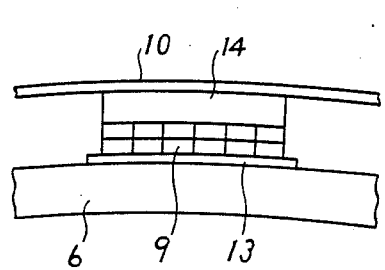

FIG. 7 shows another modification of the first embodiment, in which the windings 9, 9 . . . are sandwiched between the vibrationproofing rubber 13 and a mass body 14 of non-magnetic material, such as stainless steel, and secured to the bobbin 6 by a band 10.

Figure 8:
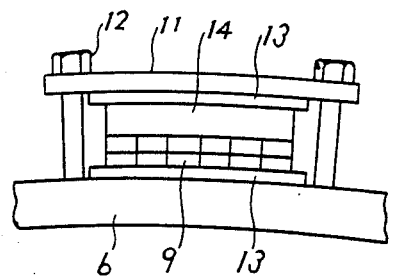

FIG. 8 shows still another modification, in which the windings 9, 9 . . . are secured to the bobbin 6 by a pressure plate 11 and bolts 12, 12 . . . instead of the band 10.

In the above constructions, the high frequency components of vibrations are attenuated by the vibration-proofing rubber and the characteristic frequency of the coil is also lowered by the mass body 14, thereby enlarging the frequency domain of the damping effect.

Figure 9:
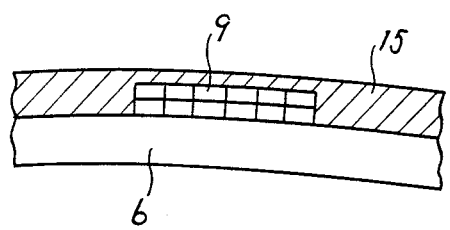
FIG. 9 is a partially sectional view of a second embodiment.

FIG. 9 shows a second embodiment of the invention, in which a bobbin 6 and windings 9, 9 . . . secured thereto are integrally molded with a damping material 15. Epoxy derivative binary reaction type resin, for example, is suitable for the damping material. The coils in this embodiment are manufactured in such a manner that the windings 9, 9 . . . are temporarily fixed to the bobbin 6 and a damping material 15 having fluidity prior to reaction, is coated on the entire outer peripheries of the windings 9, 9 . . . and bobbin 6 and then cured, thereby integrally securing the windings 9, 9 . . . onto the bobbin 6.

Thus, the damping material 15 molds or encapsulates the windings 9, 9 . . . and bobbin 6, whereby a layer of damping material 15 of sufficient thickness is formed by effectively using the space between the coils, thereby enabling a large damping effect to be obtained. As a result, it is possible to largely reduce vibrations generated by the inclined magnetic field coils 3 through 5 and bobbin 6 by the electromagnetic mechanical force.

In the above embodiment the windings 9, 9 . . . are completely molded by the damping material 15, however the windings 9, 9 . . . may be exposed in part when the electromagnetic mechanical force is small.

INDUSTRIAL APPLICABILITY

The present invention is applicable as suppression means for vibrations and noises in the inclined magnetic field coils used for the nuclear magnetic resonance imaging diagnostic apparatus.

I claim:

1. A nuclear magnetic resonance imaging diagnostic apparatus, comprising:

(a) a cylindrical main coil (2) disposed concentrically surrounding a patient examination zone defined by a cylindrical bobbin (6) and spaced therefrom, (b) a plurality of inclined magnetic field coils (3,4,5) disposed in a magnetic field generated by said main coil and wound around an outer surface of said bobbin, (c) a discrete layer of flexible damping material (13) interposed between inner surfaces of said inclined magnetic field coils and said outer surface of said bobbin to absorb audible frequency vibrations generated by the field coils in response to signals induced therein by the magnetic field of the main coil and thereby shield the examination zone from such vibrations, and (d) an inertial mass of non-magnetic material (14) rigidly coupled to said inclined magnetic field coils to reduce the characteristic vibration frequency of each of said inclined magnetic field coils.

2. An apparatus as set forth in claim 1, wherein said inertial mass is made of stainless steel.

3. An apparatus as set forth in claims 1 or 2, wherein said vibration damping material is made of rubber.

4. A nuclear magnetic resonance imaging diagnostic apparatus, comprising: a cylindrical main coil (2) disposed concentrically surrounding a patient examination zone defined by a cylindrical bobbin (6) and spaced therefrom, a plurality of inclined magnetic field coils (3,4,5) disposed in a magnetic field generated by said main coil and wound around an outer surface of said bobbin, and a discrete layer of vibration damping material (15) integrally molded with and surrounding said inclined magnetic field coils and said bobbin to absorb audible frequency vibrations generated by the field coils in response to signals induced therein by the magnetic field of the main coil and thereby shield the examination zone from such vibrations.

5. An apparatus as set forth in claim 4, wherein said damping material is an epoxy derivative binary reaction type resin.

* * * * *